US006658731B1

(12) United States Patent
Goenka et al.

(10) Patent No.: US 6,658,731 B1
(45) Date of Patent: Dec. 9, 2003

(54) METHOD FOR FABRICATING CONNECTORS FOR INTERCONNECTING ETCHED TRI-METAL CIRCUIT STRUCTURES

(75) Inventors: Lakhi Nandlal Goenka, Ann Arbor, MI (US); Mohan R. Paruchuri, Canton, MI (US); Thomas B Krautheim, Belleville, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 267 days.

(21) Appl. No.: 09/703,554

(22) Filed: Nov. 1, 2000

(51) Int. Cl.[7] .............................. H05K 3/02; H05K 3/10
(52) U.S. Cl. .............................. 29/846; 29/825; 29/830; 29/840; 439/82; 439/943; 174/261; 174/263
(58) Field of Search ..................... 29/830, 825, 846, 29/852, 840, 842; 439/82, 76, 943; 174/260–264

(56) References Cited

U.S. PATENT DOCUMENTS 3,526,867 A * 9/1970 Keeler, II ..................... 439/74
3,801,388 A   4/1974 Akiyama et al.
4,404,059 A   9/1983 Livshits et al.
5,477,086 A  12/1995 Rostoker et al.
5,889,657 A * 3/1999 Kono ........................ 257/692
6,111,204 A * 8/2000 Goenka ...................... 174/250

FOREIGN PATENT DOCUMENTS

EP    1 026 928 A2    9/2000
FR    2 758 015 A1    3/1998
JP    53-51965      * 10/1976 .................. 29/852

* cited by examiner

Primary Examiner—Richard Chang

(57) ABSTRACT

In conventional ETM circuit structures a pin connector in which the pin is etched from the ETM substrate and the mating cavity is etched from the ETM substrate to be mated. The connector utilizes the subtractive ETM structure processing to define any one of several pin-cavity configurations. The pin serves as an anchor with the metallurgical bonds with solder in the cavity that forms on the copper surfaces of the ETM circuit structure to give good mechanical strength to the connection. In particular four different configurations of interconnections are shown and described.

8 Claims, 2 Drawing Sheets

METHOD FOR FABRICATING CONNECTORS FOR INTERCONNECTING ETCHED TRI-METAL CIRCUIT STRUCTURES

BACKGROUND OF THE INVENTION

1. Field of the Invention

This invention relates generally to Etched tri-Metal "ETM" electronic circuit assemblies and more particularly to a connector and a method for making a connection from one ETM circuit to another ETM circuit using the connector.

2. Description of the Related Art

In the field of electronics manufacturing, various additive and subtractive processes are known for constructing printed circuit boards (PCBs). Among these are the processes disclosed in U.S. Pat. No. 3,801,388 issued on Apr. 2, 1974 to Akiyama et al. which is a subtractive process; U.S. Pat. No. 4,404,059 issued on Sep. 13, 1983 to Livshits et al is an additive process; and U.S. Pat. No. 5,738,797 issued on Apr. 14, 1998 to Belke, Jr. et al that is assigned to a common assignee which is a subtractive process. All three of these patents are incorporated herein by reference. These patents describe various additive and subtractive plating and chemical etching processes for constructing multi-layer PCBs having air bridges.

The air bridge structures disclosed in these patents are useful in offering design flexibility and printed circuit board real estate savings as far as routing and layout of circuit traces. However, these patents do not disclose or suggest any approach for accommodating certain circuit board interconnect processes such as connecting one ETM circuit structure to a her ETM circuit structure.

In the prior art, interconnecting PCBs had to have in-lined plated-through holes. These holes, in each PCB, had to be carefully registered with the correspond hole in the other PCB. When the holes were aligned, either a solder joint was formed or an interconnecting pin was inserted in the holes and the hole was filled with solder. Such a process was an expensive method when utilizing multi-layer ETM circuit structures.

SUMMARY OF THE INVENTION

It is a principal advantage of the present invention to interconnect two ETM circuit structures in a less costly manner.

It is another advantage to form an interconnection between two ETM circuit structures with a connection that is sufficient to carry the designed amount of current density and not be either over-designed or under-designed.

It is yet another advantage to form an interconnection that has the necessary strength to maintain the circuit operation that is to be performed by the printed circuit board.

These and other advantages will become apparent from a connector fabricated as illustrated and described herein. The method for fabricating a connector for interconnecting Etched Tri-Metal, ETM, circuit structures has the steps of first forming on a first ETM circuit structure one or more connector-pedestal structures fabricated thereon for the purpose of forming one portion of a connector. Next, on a second ETM circuit structure there is formed one or more connector-pedestal structures fabricated thereon for the purpose of forming another portion of a connector. A bonding material is then spread on the second ETM structure for joining the connector-pedestal structures of the first ETM circuit in an interlocking manner with the connector-pedestal structures of the second ETM circuit. The two ETM circuit structures are then meshed in such a manner that the bonding material flows about and around the connector-pedestals on each of the first and second ETM circuits. To secure the connection the bonding material is activated forming both an electrical and structural bond between the connector-pedestals of the first and second ETM circuits.

BRIEF DESCRIPTION OF THE DRAWINGS

These and other advantages will become apparent from a connector fabricated as illustrated in the following drawings in which.

DETAILED DESCRIPTION OF THE PREFERRED EMBODIMENT

Figure 1:
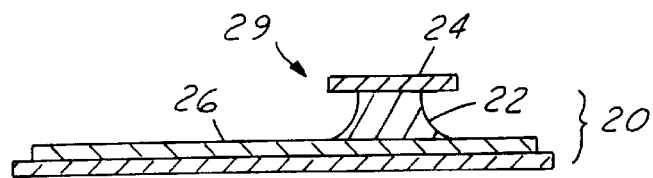
FIG. 1 is a sectional view of an etched tri-metal material.

Referring to the Figs by the characters of reference there is illustrated a pin connector 10–13 in which the pin is etched from a first ETM substrate 16 in a circuit structure. The mating cavity is etched from a second ETM substrate 18 in another circuit structure which is to be mated. The connectors 10–13 utilize the ETM structure and processing for multi-layer material 20 to define the pin and cavity. The pin in turn serves as an "anchor" with the metallurgical bonds with the solder within the cavity forming on the copper surfaces of the multi-layer material to give good mechanical structural strength to the connection. The Etched Tri-layer Metal (ETM) circuit structures are a multi-layer material 20 comprising a first layer 22 of aluminum and a second layer 24 of copper, and a third layer 26 of copper.

The basic process in the preferred embodiments for forming the connectors 10–13 is a subtractive plating and chemical etching process for constructing multi-layer material. At a predetermined time in the process, the multi-layer material 20 is bonded to a substrate 28. An example of a tri-metal multi-layer material 20 is illustrated in cross-section in FIG. 1. The subtractive process is disclosed and defined in U.S. Pat. No. 3,801,388, entitled "Printed Circuit Board Crossover and Method for Manufacturing the Same", issued to Akiyama et al. on Apr. 2, 1974 and assigned to Sony Corporation. In addition U.S. Pat. No. 4,404,059 issued to Livshits et al. on Sep. 13, 1983 discloses and defines the additive process. U.S. Pat. No. 5,738,797 issued to Belke, Jr. et al. on Apr. 14, 1998 entitled "Three-Dimensional Multi-Layer Circuit Structure and Method for Forming the Same" is an additive process and is assigned to a common assignee. Each of these tents is incorporated herein by reference.

For the purposes of background, the subtractive process involves the following steps. A tri-metal layer material or laminate is provided having a first or central layer 22 of a first metal such as aluminum. Overlying the aluminum on each side is a second or upper layer 24 and a third or lower layer 26 forming a conductor network layer of a second metal that is typically copper. Cladding the second metal upper 24 and the lower 26 layers onto the first metal central layer 22 is one method to produce this tri-metal laminate.

Next, upper and lower etch-resist masks are disposed on the exposed surfaces of the upper 24 and lower 26 conductor network layers. The upper and lower masks correspond to predefined upper and lower circuit patterns to be formed in the respective conductor network layers. The masks also have respective apertures therein through which portions of the conductor network layers are exposed.

Then the masked laminate is exposed to an etchant, which etches substantially only the second metal or upper layer which in the preferred embodiment is copper, such that the portions of the second metal exposed through the mask apertures are etched away. The masks are then stripped off and the structure is then attached to an electrically insulated surface of a substrate 28.

The structure is exposed to an etchant that substantially etches only the first metal so as to etch away substantially all of the metal foil except for those portions sandwiched between the top and bottom conductor networks. These sandwiched portions are much less aggressively etched because the top and bottom conductor networks act essentially as etch-resist masks, since the metal of these networks is not appreciably etched by the aforementioned etchant. After etching, these sandwiched portions 29 typically assume an hour-glass-like shape which are herein referred to as "pedestals", "support elements" or the like. In the present invention, the pedestals herein are identified as connector-pedestals for the purposes of these embodiments.

The method for fabricating a connector for interconnecting Etched Tri-Metal, ETM, circuit structures according to the present invention begins with forming on a first ETM circuit structure or multi-layer material 20 one or more connector-pedestal structures 29 for the purpose of forming one portion of a connector 10–13. In addition, to calling these connector-pedestals, the are also identified as pins to be consistent with the connector art. Next on a second ETM circuit structure or multi-layer material 20 there are formed one or more connector-pedestal structures 29 for the purpose of forming another portion of the connector. Depending on which ETM circuit structure that is being used, the connector-pedestals are identified as pins on one ETM circuit structure and the on the other ETM circuit structure the connector-pedestals are used to form a cavity.

Next, a bonding material 34 is on or adjacent to the connector-pedestals on the second ETM structure for joining the connector-pedestal structures, or pins, of the first ETM circuit in an interlocking manner with the connector-pedestal structures of the second ETM circuit, that form a cavity.

The first and second ETM circuit structures are then meshed in such a manner that the bonding material 34 flows about and around the connector-pedestals on each of the first 16 and second 18 ETM circuit structure. Then, the bonding material 34 is activated to form a bond between the connector-pedestals, or pins and cavities, of the first and second ETM circuits.

Figure 2:
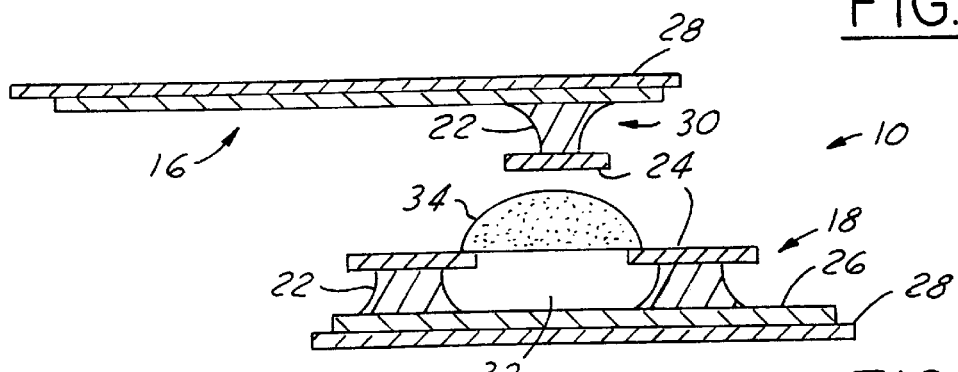
FIG. 2 is one embodiment of the connector with the two ETM circuit structures spaced apart before the step of meshing.
Figure 3:
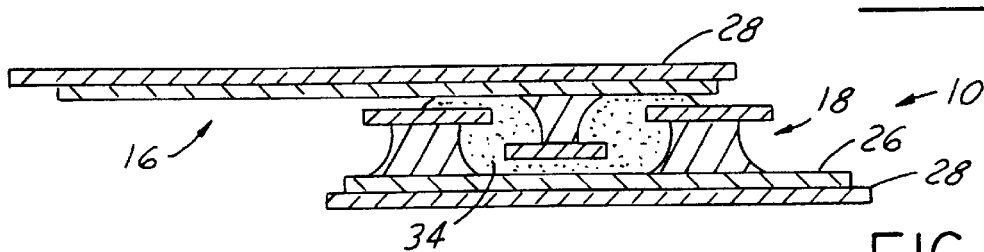
FIG. 3 illustrates the embodiment of FIG. 2 with the two ETM circuit structures meshed forming a lap joint.

Referring to FIGS. 2 and 3, the first ETM circuit structure 16 has a single connector-pedestal 29 and the second ETM structure 18 has a pair of connector-pedestals 29 spaced apart a distance slightly larger than the size of top of the single connector-pedestal on the first ETM circuit structure. The bonding material 32, which is a solder paste, is spread across the top surface of the pair of connector pedestals on the second ETM circuit structure 18. The first and second ETM circuit structures 16, 18 are meshed with the single connector-pedestal of the first ETM circuit structure aligned with the spacing between the pair of connector-pedestals on the second ETM circuit structure. As the structures are meshed, the solder paste flows to encapsulate the connector-pedestals on both of the ETM circuit structures 16, 18. This bonds the upper layer 24 of each ETM circuit structure with the exposed lower layer 26 of the other ETM circuit structure. This particular structure is utilized in a low current-density connection.

The meshed ETM circuit structures 16, 18 are then subjected to a sufficiently high temperature heat source to activate the bonding material 34 or solder paste causing the solder to flow around the pin 30 and in the cavity 32. After the solder has flowed, the interconnected ETM circuit structures are cooled solidifying the solder.

Figure 4:
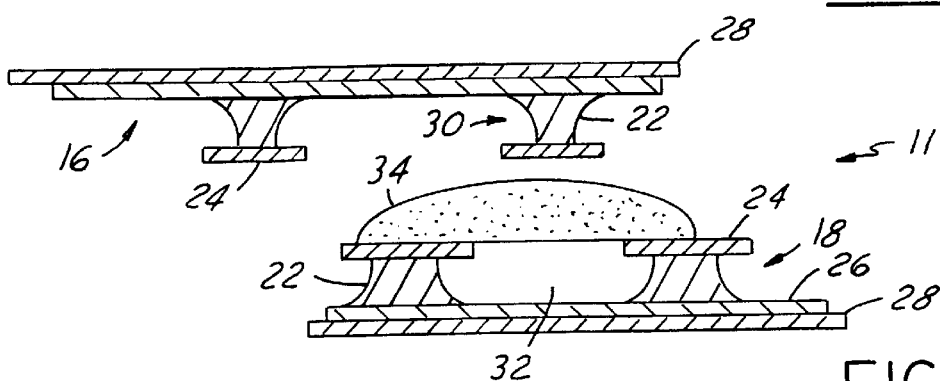
FIG. 4 is another embodiment of the connector with the two ETM circuit structures spaced apart before the step of meshing.
Figure 5:
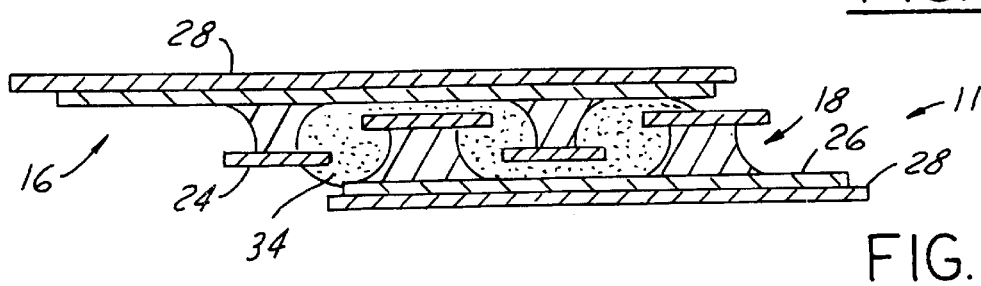
FIG. 5 illustrates the embodiment of FIG. 4 with the two ETM circuit structures meshed forming a lap joint.

Referring to FIGS. 4 and 5 each of the ETM circuit structures 16, 18 has a pair of connector-pedestals 29 and the solder paste 34 is spread across the tops of the connector-pedestals on the second ETM circuit structure 18. The first and second ETM circuit structures are meshed with one of the connector-pedestal of the first ETM circuit structure aligned with the spacing between the pair of connector-pedestals 29 of the second ETM circuit structure 18. As the structures are meshed, the solder paste flows to encapsulate the connector-pedestals 29 on both of the ETM circuit structures. This bonds the upper layer 24 of one ETM circuit structure 16 with the exposed lower layer 26 of the other ETM circuit structure 18.

The meshed ETM circuit structures are then subjected to a sufficiently high temperature heat source to activate the solder paste causing the solder to flow around the pins 30 and in the cavity 32. After the solder has flowed, the interconnected ETM circuit structures are cooled solidifying the solder.

Figure 6:
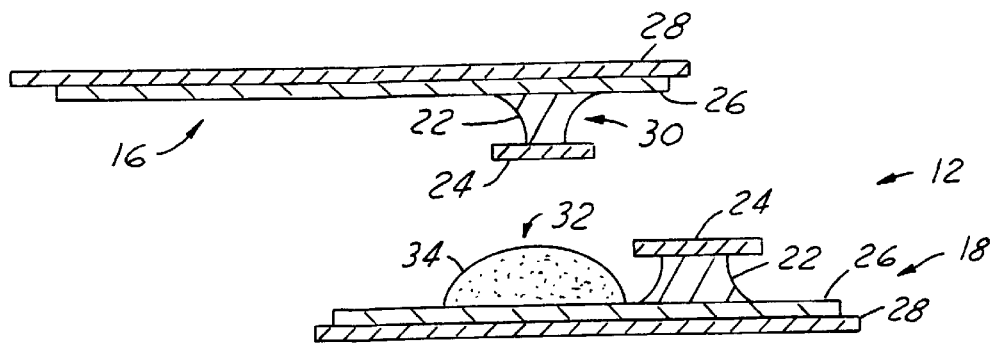
FIG. 6 is still another embodiment of the connector with the two ETM circuit structures spaced apart before the step of meshing.
Figure 7:
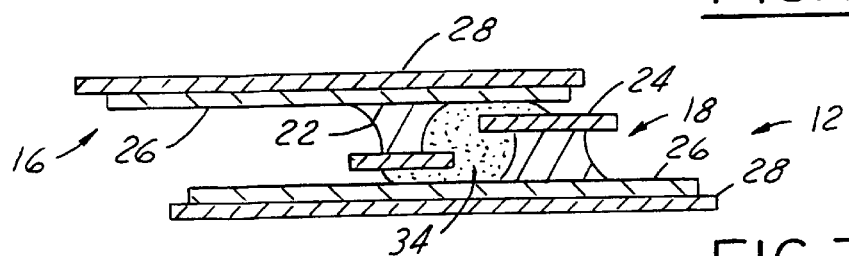
FIG. 7 illustrates the embodiment of FIG. 6 with the two ETM circuit structures meshed forming a lap joint.

Referring to FIGS. 6 & 7 each of the ETM circuit structures 16, 18 has a single connector-pedestal 29 and the solder paste is spread adjacent the connector-pedestal on the second ETM circuit structure 18. The first and second ETM circuit structures are meshed with the single connector-pedestal 29 or pin 30 of the first ETM circuit structure 16 aligned with the solder paste in the cavity 32 adjacent the connector-pedestal 29 on the second ETM circuit structure 18. As the structures are meshed, the solder paste flows to encapsulate the connector-pedestals on both of the ETM circuit structures. This bonds the upper layer 24 of one ETM circuit structure with the exposed lower layer 26 of the other ETM circuit structure.

The meshed ETM circuit structures are then subjected to a sufficiently high temperature heat source to activate the solder paste causing the solder to flow around the pin and in the cavity. After the solder has flowed, the interconnected ETM circuit structures are cooled solidifying the solder.

Figure 8:
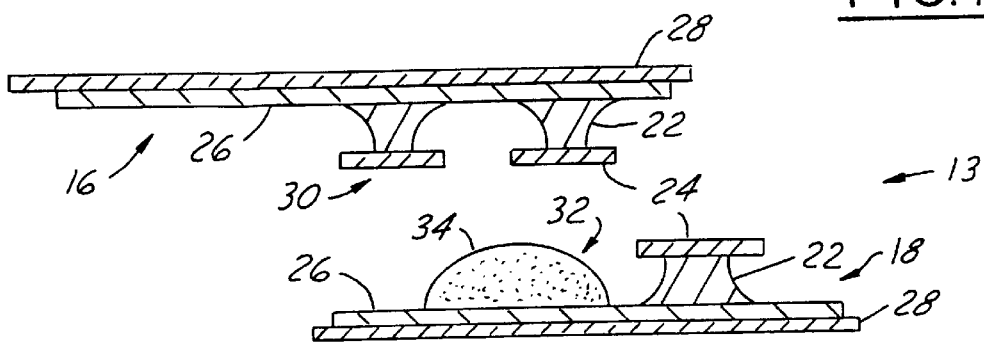
FIG. 8 is yet another embodiment of the connector with the two ETM circuit structures spaced apart before the step of meshing.
Figure 9:
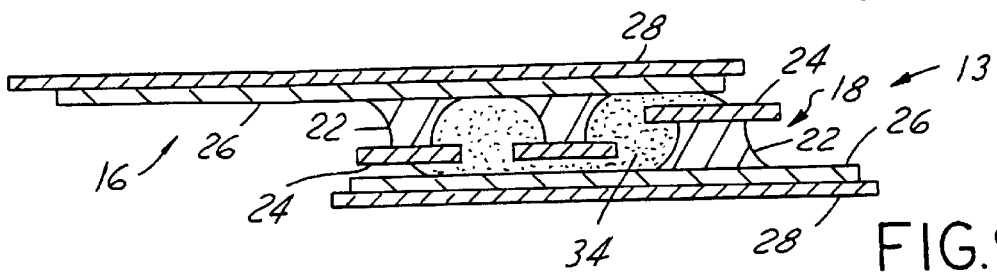
FIG. 9 illustrates the embodiment of FIG. 8 with the two ETM circuit structures meshed forming a lap joint.

Referring to FIGS. 8 and 9, the first ETM circuit structure 16 has a pair of spaced apart connector-pedestals 29 and the second ETM circuit structure 18 has a single connector-pedestal 29 and the solder paste is spread in the cavity 32 adjacent the connector-pedestal on the second ETM circuit structure. The first and second ETM circuit structures are meshed with the pair of connector-pedestal of the first ETM circuit structure aligned with the solder paste adjacent the connector-pedestal on the second ETM circuit structure. As the structures are meshed, the solder paste flows to encapsulate the connector-pedestals on both of the ETM circuit structures. This bonds the upper layer 24 of one ETM circuit structure with the exposed lower layer of the other ETM circuit structure. This particular structure is utilized in a high current-density connection and the current is carried through the aluminum.

The meshed ETM circuit structures are then subjected to a sufficiently high temperature heat source to activate the solder paste causing the solder to flow around the pin and in the cavity. After the solder has flowed, the interconnected ETM circuit structures are cooled solidifying the solder.

In each of the embodiments of the connectors 10–13, melting the solder locally with a hot knife or soft beam can repair the joint and the joint can be then readily disconnected. A new joint can also be readily formed as before.

There has thus been shown and described several connector structure embodiments for connecting a first ETM circuit structure to a second ETM circuit structure. In each embodiment, the connector is fabricated according to conventional subtractive air bridge construction process.

What is claimed is:

1. A method for fabricating a connector for interconnecting the substrates of Etched Tri-Metal circuit structures comprising the steps of:
   a. securing a first tri-metal layer material having a first metal with parallel broadside surfaces overlaid on each broadside with a second metal layer, said second metal layer bonded to said first metal;
   b. disposing etch-resist masks on the exposed surface of each second metal layer defining first and second circuit patterns including at least one pedestal pattern;
   c. etching said second metal layer forming said first and second circuit patterns and exposing said first metal free of circuit patterns;
   d. bonding one of the second metal layers to a substrate;
   e. etching the first metal in areas free of circuit patterns to form one or more pedestal patterns on the first circuit;
   f. securing a second tri-metal layer material and performing the aforementioned steps a–e on the second tri-metal material;
   g. spreading a bonding material on one of the first circuit pattern for joining the pedestal patterns on each substrate in an interlocking manner;
   h. meshing the first and second substrates in such a manner that the bonding material flows about and around the pedestal patterns on each of the first and second substrates; and then
   i. activating the bonding material forming a bond between the pedestal patterns of the first and second substrates.

2. The method according to claim 1 wherein the first circuit pattern on the first substrate has a single pedestal pattern and the first circuit pattern on the second substrate has a pair of pedestal patterns.

3. The method according to claim 2 wherein said step of spreading a bonding material includes the step of spreading a solder paste on the top surface of the pair of pedestal patterns on the second substrate.

4. The method according to claim 3 wherein said step of meshing the first and second circuit structures, the single pedestal pattern of the first circuit structure is aligned with the spacing between the pair of pedestal patterns flowing the solder paste to encapsulate the pedestal patterns on both of the substrates bonding the upper layer of each pedestal patterns with the exposed second layer of the other substrate.

5. The method according to claim 4 wherein said step of activating is by means of applying a sufficiently high temperature causing the solder paste to flow.

6. The method according to claim 5 additionally including a step of cooling the interconnected first and second pedestal patterns.

7. The method according to claim 2 wherein the first substrate has at least a pair of pedestal patterns and the second substrate has at least a pair of pedestal patterns spaced apart a distance slightly larger than the size of top of the pedestal patterns on the first substrate.

8. The method according to claim 7 wherein said step of spreading a bonding material includes the step of spreading a solder paste on the top surface of the pedestal patterns on the second substrate.

* * * * *